United States Patent [19]
Driscoll et al.

[11] Patent Number: 5,250,871
[45] Date of Patent: Oct. 5, 1993

[54] LOW VIBRATION SENSITIVITY CRYSTAL RESONATOR ARRANGEMENT

[75] Inventors: Michael M. Driscoll, Ellicott City; Norman G. Matthews, Sparks, both of Md.

[73] Assignee: Westinghouse Electric Corp., Pittsburgh, Pa.

[21] Appl. No.: 713,260

[22] Filed: Jun. 13, 1991

[51] Int. Cl.$^5$ ............................................. H01L 41/08
[52] U.S. Cl. ................................... 310/348; 310/311; 310/360; 310/361
[58] Field of Search ............... 310/311, 348, 360, 361; 331/116 R, 158, 162

[56] References Cited
U.S. PATENT DOCUMENTS

| | | | |
|---|---|---|---|
| Re. 29,559 | 2/1978 | Epstein | 310/360 |
| 3,714,476 | 1/1973 | Epstein | 310/360 |
| 4,344,010 | 8/1982 | Vig et al. | 310/361 |
| 4,410,822 | 10/1983 | Filler | 310/311 |
| 4,575,690 | 3/1986 | Walls et al. | 331/116 R |
| 4,701,661 | 10/1987 | Warner et al. | 310/360 |
| 4,802,371 | 2/1989 | Calderara et al. | 73/862.04 |
| 4,851,790 | 7/1989 | Driscoll | 331/116 R |
| 4,891,611 | 1/1990 | Frerking | 331/158 |

Primary Examiner—Mark O. Budd
Assistant Examiner—Thomas M. Dougherty
Attorney, Agent, or Firm—W. G. Sutcliff

[57] ABSTRACT

An arrangement of crystal resonators that provides significantly reduced net resonator vibration sensitivity by arranging the crystallographic axes of some of the resonators to have antiparallel relationship, without regard to the acceleration sensitivity vector of any of the crystal resonators.

3 Claims, 4 Drawing Sheets

LOW VIBRATION SENSITIVITY CRYSTAL RESONATOR ARRANGEMENT

BACKGROUND OF THE INVENTION

The present invention relates to crystal oscillators, and more particularly, to a crystal oscillator structure that significantly reduces the sensitivity of a crystal oscillator to vibration.

The use of crystal resonators to control an oscillator is well known. The frequency of the crystal controlled oscillator is primarily depended upon the natural resonant frequency of the crystal resonator. However, the natural resonant frequency of the crystal resonator changes when acceleration forces are applied to the crystal resonator. This problem and prior attempts at solving the unwanted frequency changes due to these acceleration forces are shown in, for example, U.S. Pat. No. 4,410,822 to Filler: U.S. Pat. No. 4,575,690 to Walls et al.: and U.S. Pat. No. 4,851,790 to Driscoll. In both U.S. Pat. No. 4,575,690 and 4,410,822, the acceleration sensitivity vectors of respective crystal resonators need to be matched. In addition, the crystal resonators need to be aligned so that their respective acceleration sensitivity vectors are positioned in very accurate orientations with respect to each other. These approaches are not easily implemented, are subject to alignment errors and are subject to alignment changes due to vibration. As a result, the prior approaches were very expensive and not practically implementable.

U.S. Pat. No. 4,851,790 discloses a structure that mechanically isolates a crystal resonator and associated sustaining stage. The crystal resonator is then mounted on vibration dampers. The improvement that this approach provides depends, in large part, upon the material used and the structure of the vibration dampers or isolators.

Another technique to reduce the vibration sensitivity of a crystal resonator is to use accelerometers to control an oscillator frequency modulation circuit to produce a frequency that changes in an equal and opposite direction to the change in frequency induced in the crystal resonator due to the applied acceleration forces. This technique results in approximately a 10:1 reduction in vibration sensitivity. This improvement, however, is limited to several hundreds hertz. This approach is also impractical due to the inability to obtain reproducible results over a wide range of vibrational frequencies; the high cost associated with obtaining accurate accelerometer alignment, and proper cancellation signal phasing as well as the inability to maintain the cancellation signals with the proper ratios due to changes in the crystal resonator and/or accelerometer vibration sensitivity with time and temperature.

Another technique used for reducing the vibration sensitivity of a crystal resonator is to use two crystals that have been carefully mounted so that their respective vibration sensitivity vectors change by the same amount in response to a given acceleration force. If the crystals are carefully mounted so that their vibration sensitivity vectors are positioned in opposite directions, the resultant resonator will have a zero acceleration sensitivity vector. This approach, however, is extremely impractical because it is almost impossible to find crystals matched as needed. The acceleration vector of each crystal would need to be carefully measured and the crystals must be carefully mounted at a very precise angle with respect to each other.

SUMMARY OF THE INVENTION

It is an object of the present invention to provide a low vibration sensitivity crystal resonator arrangement.

It is another object of the present invention to provide a compact, low vibration sensitivity crystal resonator arrangement.

It is still a further object of the present invention to provide a low vibration sensitivity crystal resonator arrangement that does not depend upon exact matching of crystal resonators.

It is still a further object of the present invention to provide a low vibration sensitivity crystal resonator that does not depend on precise mounting orientations of crystal resonators.

It is still a further object of the present invention to provide an easily manufacturable low vibration sensitivity crystal resonator arrangement.

To achieve the above and other objects, the present invention provides a low vibration sensitivity crystal resonator arrangement that comprises a plurality of crystal resonators, each having orthogonal crystallographic axes; a first pair of said crystal resonators being positioned so that two of the crystal graphic axes of one of said first pair are in antiparallel relationship with two of the crystal graphic axes of the other one of said first pair, and a second pair of said crystal resonators being positioned so that two of the crystal graphic axes of one of said second pair are in antiparallel relationship with two of the crystal graphic axes of the other one of said second pair, and so that a third crystal graphic axes of each of said first pair is in antiparallel relationship with a third crystal graphic axis of each of said second pair.

DESCRIPTION OF THE PREFERRED EMBODIMENTS

Figure 1:
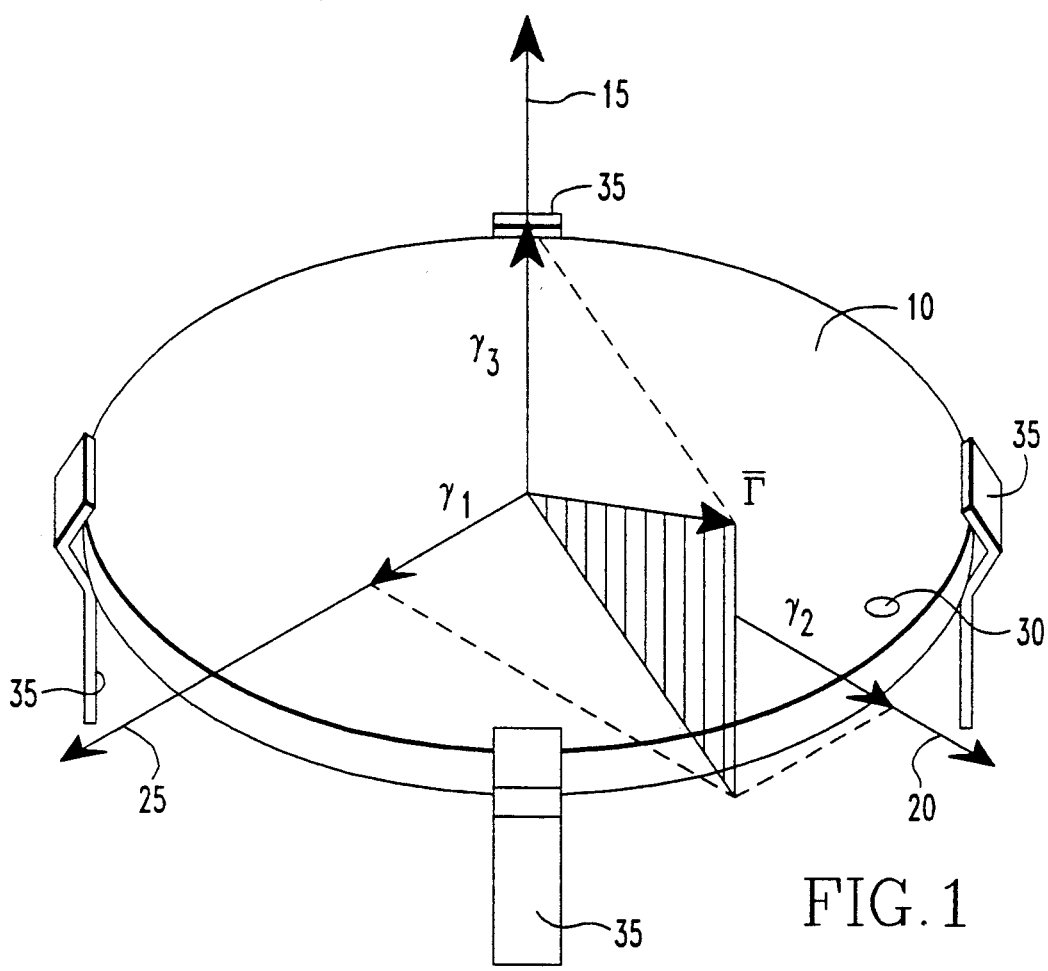
FIG. 1 schematically illustrates a horizontally mounted crystal resonator and its associated acceleration sensitivity vector.

FIG. 1 schematically illustrates a horizontally mounted crystal resonator 10 and its associated acceleration sensitivity vector $\bar{\Gamma}$. In FIG. 1, reference numerals 15, 20 and 25 identify crystallographic axes of the crystal resonator 10. An axis marker 30 identifies the orientation of the crystal with respect to its crystallographic axes. As known in the art, the acceleration sensitivity vector $\bar{\Gamma}$ represents the sensitivity of the crystal resonator to acceleration forces along each of the crystallographic axes. Referring to FIG. 1, the acceleration sensitivity vector $$\bar{\Gamma} = \gamma_1 \hat{i} + \gamma_2 \hat{j} + \gamma_3 \hat{k} \tag{1}$$

The magnitude of the acceleration sensitivity vector is represented by $$|\overline{\Gamma}| = \sqrt{\gamma_1^2 + \gamma_2^2 + \gamma_3^2} \qquad (2)$$

Mounting clips 35 mount the crystal resonator 10 in the known four point mounting manner. As those skilled in the art recognize, the crystal resonator 10 could also be mounted in accordance with the known two or three point mounting package. The only requirement is that the orientation of the crystallographic axes be noted on the crystal resonator 10 and/or its package.

Figure 2:
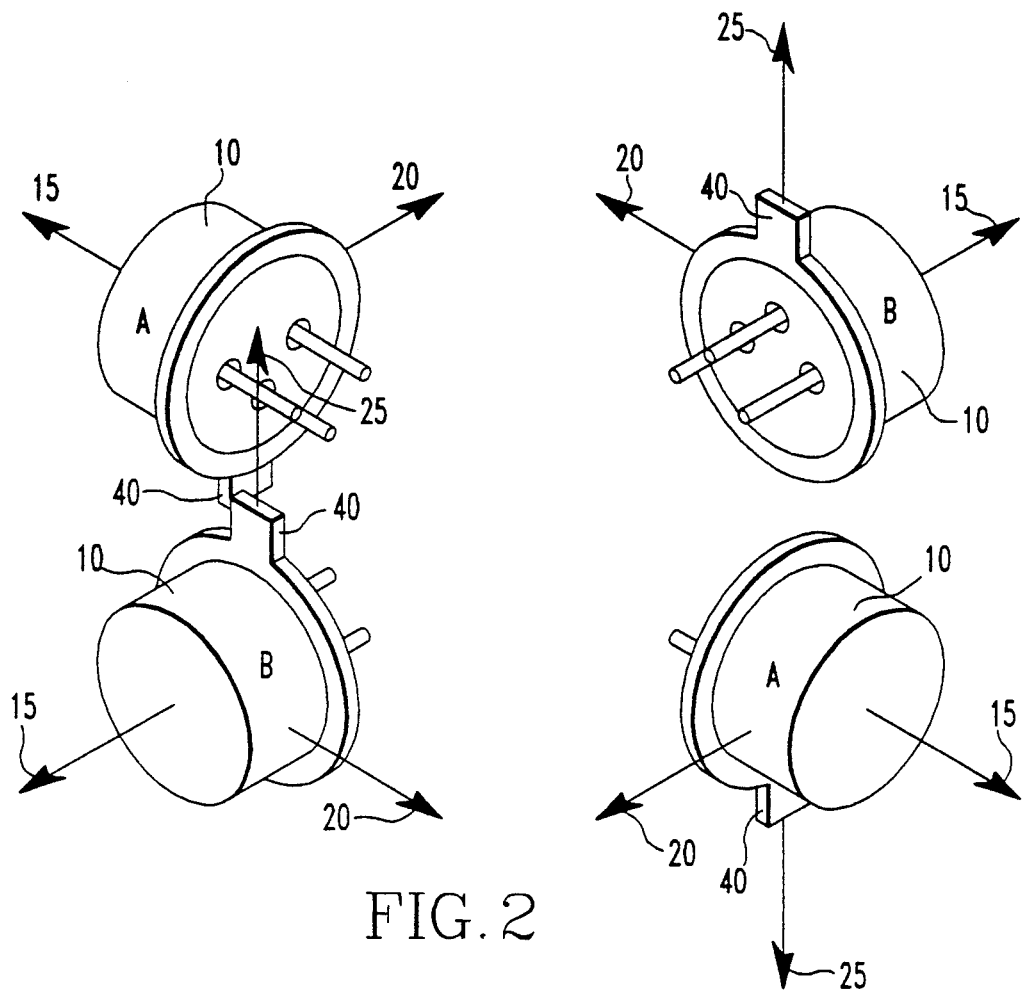
FIG. 2 schematically illustrates an arrangement of crystal resonators in accordance with the present invention.

FIG. 2 schematically illustrates an arrangement of packaged crystal resonators 10 in accordance with the present invention. In FIG. 2 a first pair of crystal resonators A each have two crystallographic axes that are in antiparallel relationship with each other. As shown in FIG. 2, the axes 20 of the crystal resonator pair A are in antiparallel relationship with each other and the axes 15 of the crystal resonator pair A are in antiparallel relationship with each other.

A second pair of crystal resonators B is positioned so that two of their crystallographic axes are in antiparallel relationship with each other. For example, the axes 15 of the crystal resonator pair B are in antiparallel relationship with each other, and the axes 20 of the crystal resonator pair B are in antiparallel relationship with each other. The crystallographic axes 25 of the crystal resonator pair A are in antiparallel relationship with the crystallographic axes 25 of the crystal resonator pair B. It is important to note, that the spacial relationship amongst the crystal resonators 10 in FIG. 2 can be achieved simply by reference to the crystal package tabs 40. There is no need to measure the magnitude and direction of the acceleration sensitivity vector of each of the crystal and delicate orientation required by prior attempts at minimizing the sensitivity of a crystal resonator to vibration are avoided by the present invention.

With the arrangement shown in FIG. 2, the net acceleration sensitivity vector $\overline{\Gamma}_{NET}$ is substantially reduced compared to the individual acceleration sensitivity vectors for each of the crystal resonators 10. When, as is known, the crystal resonators 10 are electrically connected in series, the net acceleration sensitivity vector $\overline{\Gamma}_{NET}$ is expressed as follows:

$$\overline{\Gamma}_{NET} = \overline{\Gamma}_1/4 + \overline{\Gamma}_2/4 + \overline{\Gamma}_3/4 + \overline{\Gamma}_4/4 \qquad (3)$$

where $\Gamma_1$, $\Gamma_2$, $\Gamma_3$ and $\Gamma_4$ represent the acceleration sensitivity vectors for the individual crystal resonators 10 shown in FIG. 2. The present invention provides, as seen from equation 3, two immediate benefits. First, if the series-resonators resonant frequency of any of the crystal resonators 10 shown in FIG. 2 changes by an amount $\Delta f$, the effective series resonant frequency of the 4-crystal network only changes by $\Delta f/4$. Second, equation 3 is a vector equation which inherently includes both magnitude and direction of the relevant vectors. Because of the orientation of the crystallographic axes 15, 20 and 25, even when typical degrees of acceleration sensitivity vector mismatching occurs within the pairs of crystal resonators, there is a significant improvement in the acceleration sensitivity vector of the 4-crystal network. When individual crystal resonators are identically fabricated and mounted, allowing for typical manufacturing and processing tolerances, resulting individual crystal acceleration sensitivity vector mismatch is typically 2:1 in magnitude; and in direction the match is typically such that the vector direction is confined to the same spatial spherical quadrant.

Figure 3:
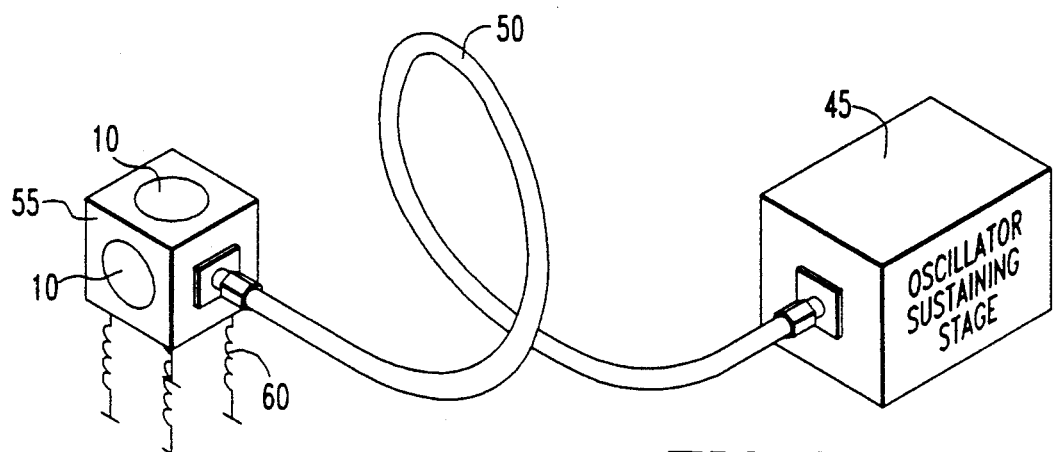
FIG. 3 is a schematic block diagram showing a crystal resonator of the present invention in a crystal oscillator.

FIG. 3 is a schematic block diagram showing the crystal resonator of the present invention in a crystal oscillator arrangement. Referring to FIG. 3, reference numeral 45 identifies an oscillator sustaining stage. Such a sustaining stage is disclosed in, for example, U.S. Pat. No. 4,851,790. The oscillator sustaining stage 45 is connected to the crystal resonator arrangement of the present invention via a cable 50. As shown in FIG. 3, the crystal resonators 10 are mounted in a block 55 with the spacial arrangement as shown in FIG. 2. The block 55 is shown mounted on optional vibration dampers 60. The cable 50 has a length that depends upon the operating frequency of the oscillator circuit. For example, the cable 50 can be a quarter wavelength coaxial cable that has approximately a 48" length at a frequency of 40 MHz. All or only a portion of the quarter wavelength transmission line can be realized using coaxial cable with the remaining portion approximated using a lumped element L-C circuit.

TABLE 1

| | Range of Acceleration Sensitivities (Parts in $10^{10}$) | | | | | |
|---|---|---|---|---|---|---|
| | INDIVIDUAL CRYSTALS | | | FOUR CRYSTAL COMBINATION | | |
| | $r_1$ | $r_2$ | $r_3$ | $r_A$ | $r_B$ | $r_C$ |
| 40 MHz, 5th O.T AT-CUT | 19 to 25 | 1 to 10 | 1 to 15 | 4.0 | 4.0 | 1.0 |
| 40 MHz, 3rd O.T. SC-CUT | 0.5 to 1.5 | ±4 to ±7 | 1.5 to 4 | 0.2 | 0.4 | 1.0 |

As seen in Table 1, the low vibration sensitivity crystal resonator of the present invention was tested using 40 MHz, fifth overtone, AT-crystal resonators and 40 MHz, third overtone, SC-cut crystal resonators. The results shown in Table 1 show that there is a very significant reduction in acceleration sensitivity, even with crystals having relatively poor acceleration sensitivity vector matching.

Figure 4:
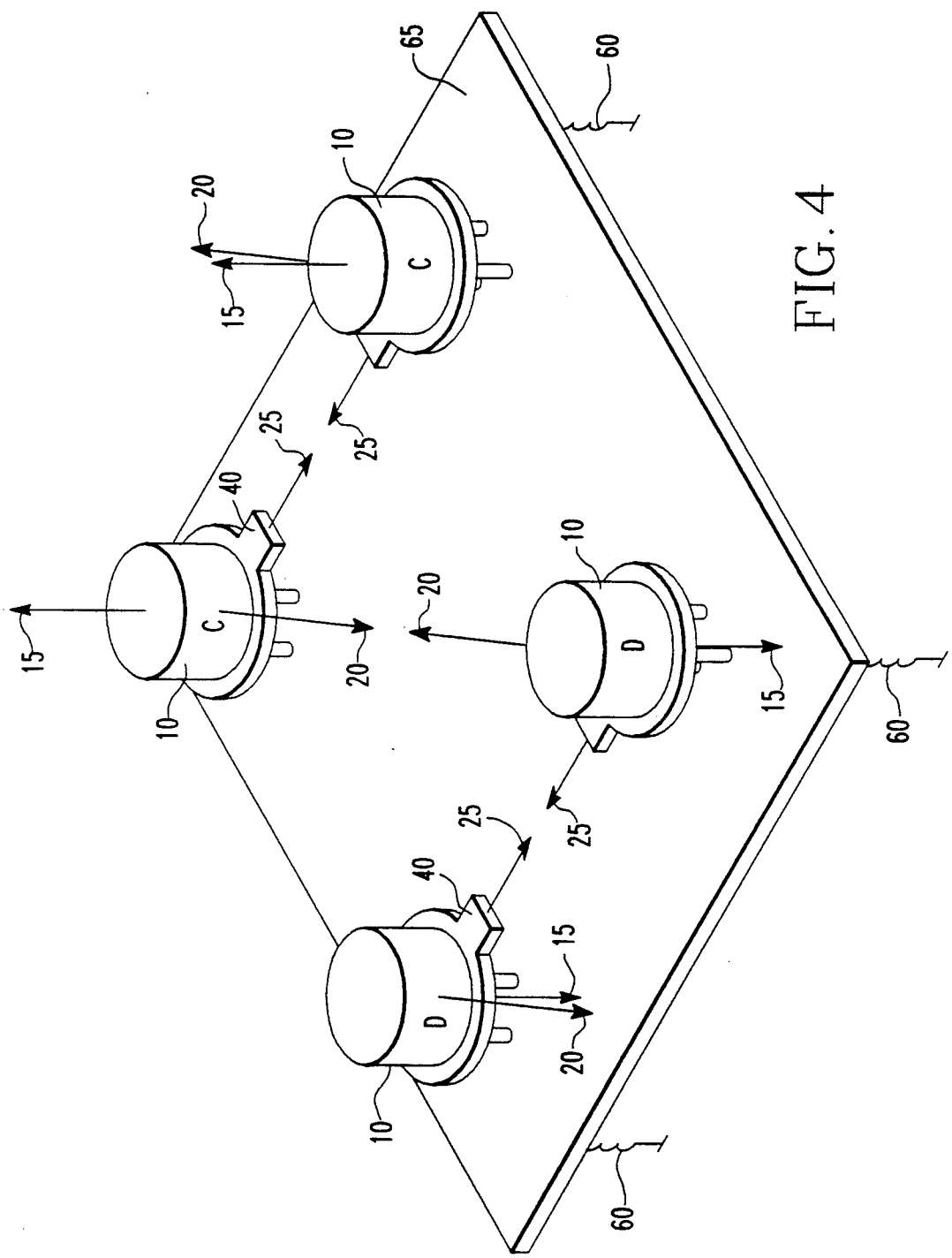
FIG. 4 schematically illustrates another arrangement of crystals in accordance with the present invention.

FIG. 4 schematically illustrates another arrangement of crystal resonators 10 in accordance with the present invention. In FIG. 4, all of the crystal resonators 10 are mounted on a single surface base (e.g., printed wiring board) 65. As shown in FIG. 4, the base 65 can be optionally mounted on vibration dampers 60. As with the embodiment shown in FIG. 2, in FIG. 4, a pair of crystal resonators C are mounted on a base 65 with two of their crystallographic axes positioned in antiparallel relationship with respect to each other. For example, the crystallographic axes 20 and 25 are in antiparallel relationship. A pair of crystal resonators D are also mounted on the base 65 with two of their crystallographic axes in antiparallel relationship. As shown in FIG. 4, the axes 20 and 25 of the crystal resonator pair D are in antiparallel relationship. The crystallographic axes 15 of crystal resonator pair C are in antiparallel relationships with the crystallographic axes 15 of the crystal resonator pair D. This arrangement is the functional equivalent of the spacial arrangement shown in FIG. 2. In addition, other arrangements could be used employing two or three point mounting packages. The respective crystallographic axes should have antiparallel relationships as shown in FIGS. 2 and 4.

Figure 5A:
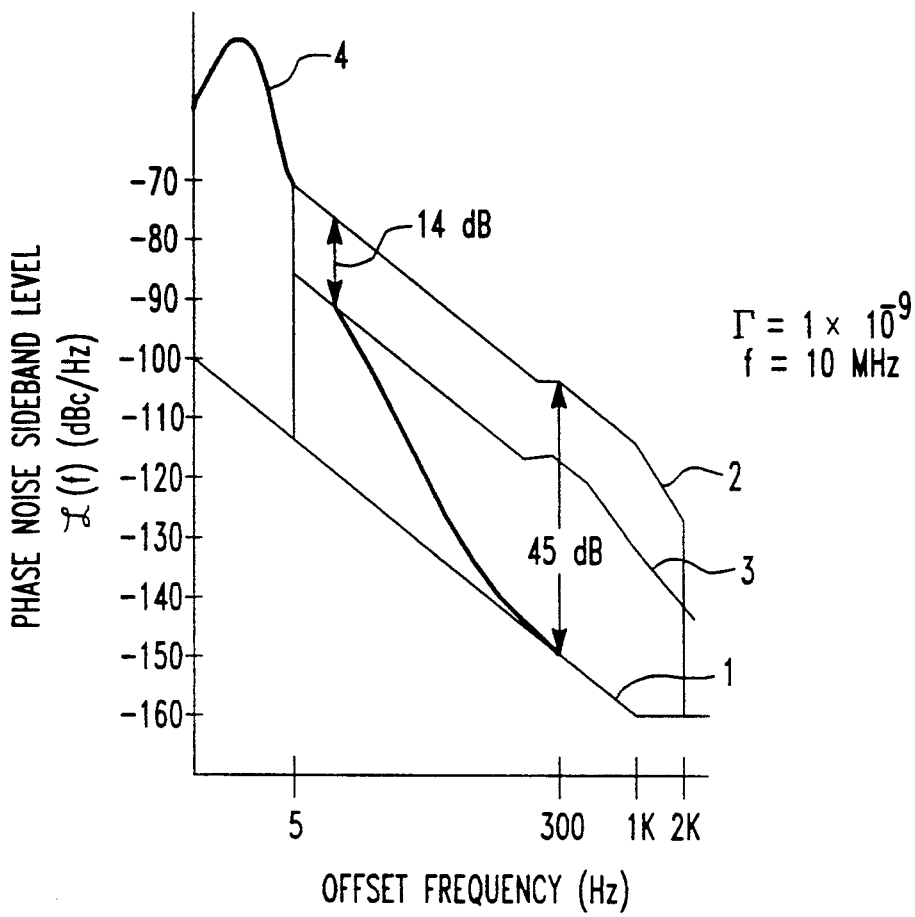
FIGS. 5A and 5B are graphs illustrating the improvement in vibration sensitivity provided by the present invention.
Figure 5B:
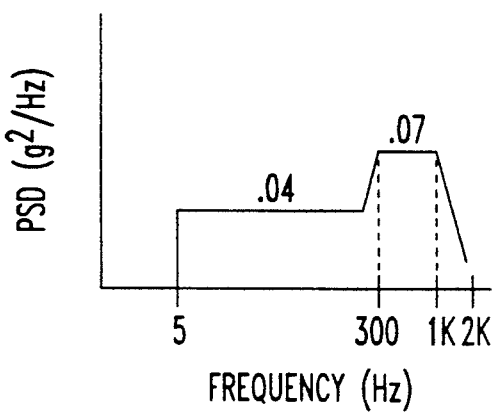

FIGS. 5A and 5B are graphs illustrating the improvement in vibration sensitivity provided by the present invention. FIG. 5B represents a random vibration envelope generated by a typical aircraft. In FIG. 5A, waveform 1 illustrates the output signal phase noise sideband spectrum of a conventional crystal oscillator that is not subjected to vibration. The data shown in FIG. 5A is based on use of a crystal resonator having an acceleration sensitivity vector of approximately $1 \times 10^{-9}$ and a resonant frequency of 10 MHz. In FIG. 5A, waveform 2 shows the output signal spectrum of a crystal oscillator subject to the vibration represented by the vibration envelope shown in FIG. 5B. Waveform 3 in FIG. 5A illustrates a 14 dB typical improvement in the operation of a crystal oscillator constructed in accordance with the present invention. Waveform 4 of FIG. 5A illustrates the improvement in performance of a crystal oscillator in accordance with the present invention when mounted on vibration dampers as discussed above. The peak in noise shown in waveform 4 below 5 Hz is due to the mechanical characteristics of the vibration dampers. As discussed above, the degree to which vibration is mechanically damped and where the vibration damping begins to take effect depends upon the material and structure of the vibration dampers. The low vibration sensitivity crystal resonator arrangement of the present invention makes the requirements on the mechanical vibrations dampers less severe.

With the above embodiments no problems have been encountered due to non-identical individual crystal series resonant frequencies. This is because typical crystals can be manufactured to series resonant frequency tolerances of less than 5 PPM. However, even more "sloppy" (i.e., less expensive) resonant frequency matching can be tolerated if each of the crystal resonators has its static capacitance (interelectrode capacitance or parallel capacitance) anti-resonated with an appropriate value parallel inductor.

The foregoing is considered as illustrative only of the principles of the invention. Further, since numerous modifications and changes will readily occur to those skilled in the art, it is not desired to limit the invention to the exact construction and application shown and described, and accordingly, all suitable modifications and equivalents may be resorted to, falling within the scope of the invention and the appended claims and their equivalents. For example the four, series connected crystal resonators depicted in FIGS. 2 and 4 may be imbedded in any of a variety of conventional crystal oscillator circuits. The circuit of FIG. 3 is only one such example of an oscillator circuit utilized to verify performance. Also, the above embodiments use four crystal resonators. Additional pairs of crystal resonators could also be used.

We claim:

1. A low vibration sensitivity crystal resonator arrangement comprising:
   a plurality of crystal resonators, each having orthogonal crystallographic axes;
   a first pair of said crystal resonators being positioned so that two of the crystallographic axes of one of said first pair are in antiparallel relationship with two of the crystallographic axes of the other one of said first pair, and
   a second pair of said crystal resonators being positioned so that two of the crystallographic axes of one of said second pair are in antiparallel relationship with two of the crystal graphic axes of the other one of said second pair, and so that a third crystallographic axis of each of said first pair is in antiparallel relationship with a third crystallographic axis of each of said second pair 2. A method of reducing the vibration sensitivity of a crystal resonator arrangement comprising the steps of:
   mounting a first pair of crystal resonators so that two crystallographic axes of one of the first pair of crystal resonators is in antiparallel relationship with two of the crystallographic axes of the other one of the first pair of crystal resonators;
   mounting a second pair of crystal resonators so that two crystallographic axes of one of the second pair of crystal resonators are in antiparallel relationship with two of the crystallographic axes of the other one of the second pair of crystal resonators, and so that a third crystallographic axis of each of the first pair of crystal resonators is in antiparallel relationship with a third crystallographic axis of each of the second pair of crystal resonators; and
   electrically connecting the crystal resonators 3. A method according to claim 2, further comprising the step of electrically connecting the crystal resonators in series.

* * * * *